United States Patent
Aksin et al.

(10) Patent No.: US 11,106,233 B1
(45) Date of Patent: Aug. 31, 2021

(54) CURRENT MIRROR ARRANGEMENTS WITH REDUCED INPUT IMPEDANCE

(71) Applicant: Analog Devices, Inc., Norwood, MA (US)

(72) Inventors: Devrim Aksin, Stokesdale, NC (US); Omid Foroudi, Greensboro, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/774,283

(22) Filed: Jan. 28, 2020

(51) Int. Cl.
*G05F 3/26* (2006.01)
*G05F 3/16* (2006.01)

(52) U.S. Cl.
CPC ............... *G05F 3/267* (2013.01); *G05F 3/16* (2013.01); *G05F 3/26* (2013.01); *G05F 3/262* (2013.01); *G05F 3/265* (2013.01)

(58) Field of Classification Search
CPC ... G05F 3/16; G05F 3/26; G05F 3/262; G05F 3/265; G05F 3/267
See application file for complete search history.

(56) References Cited

U.S. PATENT DOCUMENTS

| | | | |
|---|---|---|---|
| 4,203,012 A | 5/1980 | Boxall | |
| 5,057,792 A | 10/1991 | Gay | |
| 5,351,012 A | 9/1994 | Toumazou | |
| 5,589,800 A | 12/1996 | Peterson | |
| 6,492,871 B2 | 12/2002 | Liu et al. | |
| 7,342,463 B2 * | 3/2008 | Brokaw | H03K 3/011 327/182 |
| 7,463,014 B2 | 12/2008 | Loi et al. | |
| 7,948,319 B2 * | 5/2011 | Mukophadhyay | H03F 3/45183 330/288 |
| 8,159,206 B2 * | 4/2012 | Chao | G05F 3/30 323/314 |
| 9,122,290 B2 * | 9/2015 | Eberlein | G05F 3/16 |
| 10,845,839 B1 * | 11/2020 | Aksin | H03M 1/12 |

(Continued)

OTHER PUBLICATIONS

Prodanov et al., *CMOS Current Mirrors with Reduced Input and Output Voltage Requirements*, Article in Electronic Letters—Feb. 1996, 3 pages.

(Continued)

*Primary Examiner* — Kyle J Moody
*Assistant Examiner* — Lakaisha Jackson
(74) *Attorney, Agent, or Firm* — Patent Capital Group

(57) ABSTRACT

An example current mirror arrangement includes a current mirror circuit having an input transistor and an output transistor, where the base/gate terminal of the input transistor is coupled to its collector/drain terminal via a transistor matrix that includes a plurality of transistors. Transistors of the transistor matrix, together with the input transistor, form two parallel feedback loops, such that the input transistor is part of both loops. The first loop is a fast, low-gain loop, while the second loop is a slow, high-gain loop. At lower input frequencies, the high-gain loop may properly bias and accurately generate voltage at the base/gate terminal of the input transistor, while at higher input frequencies the fast loop may significantly extend the linear operating frequency band. Consequently, a current mirror arrangement with improvements in terms of linearity and signal bandwidth may be realized.

26 Claims, 6 Drawing Sheets

(56) References Cited

U.S. PATENT DOCUMENTS

2002/0079968 A1* 6/2002 Godfrey .............. H03F 3/45659
330/258
2013/0271095 A1* 10/2013 Jackum ................... G05F 1/56
323/270

OTHER PUBLICATIONS

Gupta et al., *Bandwidth Extension of High Compliance Current Mirror by Using Compensation Methods*, Research Article, Hindawi Publishing Corporation, Active and Passive Electronic Components, vol. 2014, Article IDS 274795, 9 pages.

Baghtash et al., *Very Low Input Impedance Low Power Current Mirror*, Analog Integr Circ Sig Process (2011), 10 pages.

Tarun et al., *Design of Low Voltage Improved Performance Current Mirror*, Control Theory and Infomatics, vol. 4, No. 2, 2014, 13 pages.

\* cited by examiner

CURRENT MIRROR ARRANGEMENTS WITH REDUCED INPUT IMPEDANCE

TECHNICAL FIELD OF THE DISCLOSURE

The present disclosure relates generally to electronic devices and, more particularly, to current mirror arrangements.

BACKGROUND

Current mirrors are one of the few building blocks that are fundamental to the general circuit designs. In particular, broadband, linear current mirrors are one of the major founding blocks of open loop broadband linear amplifiers utilized within wide range of markets, such as communication, military, automotive, industrial.

Designing current mirrors that can mirror their input current with a constant current gain to their outputs within a wide operating bandwidth in a linear fashion and in presence of the ever-increasing fundamental input signal frequency is not trivial. At a given operating frequency, linearity and signal bandwidth of a current mirror ultimately set an upper bound to the dynamic range of an amplifier, or any other circuit in which a current mirror is used. Classically, linearity is traded off with bandwidth and power. Consequently, having current mirrors that have both high linearity and wide signal bandwidth would provide a significant competitive advantage in differentiating products in a given market.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figures 1, 2:
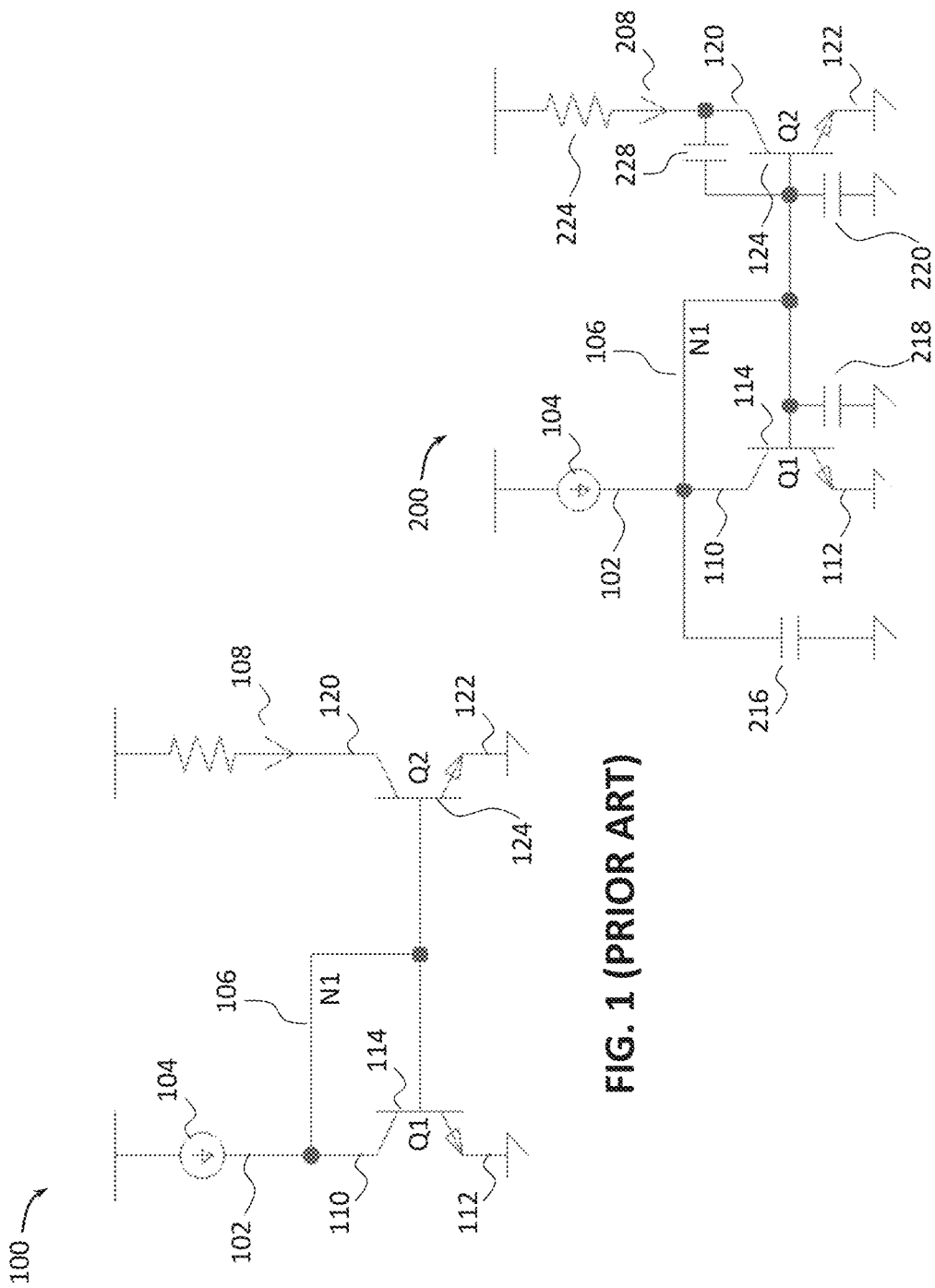
FIG. 1 provides an electric circuit diagram of an NPN implementation of a conventional current mirror with a current gain K.
FIG. 2 provides an electric circuit diagram of an NPN implementation of a current mirror of FIG. 1, additionally illustrating relevant parasitic components for high operating frequencies.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In one aspect, various current mirror arrangements are disclosed. An example arrangement includes a current mirror circuit, configured to receive an input signal (e.g., an input current signal) at an input and output a mirrored signal (e.g., a mirrored current signal) at an output. The current mirror circuit includes an input transistor Q1 and an output transistor Q2, where the base/gate terminal of the input transistor Q1 is coupled to its collector/drain terminal via a transistor matrix that includes a plurality of transistors. Transistors of the transistor matrix, together with the input transistor Q1, form two parallel feedback loops, such that the input transistor Q1 is part of both loops. The first loop may be referred to as "low-gain" while the second loop may be referred to as "high-gain" to convey the fact that the gain of the first loop is lower than the gain of the second loop. Furthermore, the first loop may be referred to as "fast" while the second loop may be referred to as "slow" to convey the fact that, when frequencies of the input signal are in a lower range of frequencies (hence: "slow"), the overall loop gain of the current mirror arrangement is dominated by the high-gain second loop, while, for higher frequencies of the input signal (hence: "fast"), the overall loop gain of the current mirror arrangement is dominated by the low-gain first loop. At relatively low input frequencies, the high-gain second loop may properly bias and accurately generate voltage at the base/gate terminal of the input transistor Q1, while at higher input frequencies the fast first loop may significantly extend the linear operating frequency band. Providing a transistor matrix that forms such a fast, low-gain first loop and a slow, high-gain second loop, each of the two loops including the input transistor Q1 of a current mirror circuit, provides a modification to the input side of the current mirror circuit that may effectively reduce its input impedance. Equivalently, it reduces both linear and the nonlinear voltage swing on node N1 to further suppress the nonlinear current contribution of the any parasitic capacitor present on this node. Consequently, a current mirror arrangement with improvements in terms of linearity and signal bandwidth may be realized.

Because various embodiments of current mirror arrangements described herein may advantageously allow reducing the input impedance of current mirror circuits (by including the first and second feedback loops as described herein), such arrangements are referred to herein as "current mirror arrangements with reduced input impedance."

The exact design of the current mirror arrangements with reduced input impedance may be realized in many different ways, all of which being within the scope of the present disclosure. In one example of design variations according to various embodiments of the present disclosure, a choice can be made, individually for each of the transistors of a current mirror arrangement with reduced input impedance (e.g., individually for each of the transistors of the current mirror circuit and the individual transistors of the transistor matrix), to employ bipolar transistors (e.g., where various transistors may be NPN and/or PNP transistors), field-effect transistors (FETs), e.g., metal-oxide-semiconductor (MOS) technology transistors (e.g., where various transistors may be N-type MOS (NMOS) and/or P-type MOS (PMOS) transistors), or a combination of one or more FETs and one or more bipolar transistors. In view of that, in the following descriptions, transistors are described with reference to their first, second, and third terminals. The term "first terminal" of a transistor is used to refer to a base terminal if the transistor is a bipolar transistor or to a gate terminal if the transistor is a MOS transistor, the term "second terminal" of a transistor is used to refer to a collector terminal if the transistor is a bipolar transistor or to a drain terminal if the transistor is a MOS transistor, and the term "third terminal" of a transistor is used to refer to an emitter terminal if the transistor is a bipolar transistor or to a source terminal if the transistor is a MOS transistor. These terms remain the same irrespective of whether a transistor of a given technology is an N-type transistor (e.g., an NPN transistor if the transistor is a bipolar transistor or an NMOS transistor if the transistor is a MOS transistor) or a P-type transistor (e.g., a PNP transistor if the transistor is a bipolar transistor or a PMOS transistor if the transistor is a MOS transistor).

In another example, in various embodiments, a choice can be made, individually for each of the transistors of a current mirror arrangement with reduced input impedance, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the current mirror arrangements with reduced input impedance as described herein that are implemented as FETs may be planar transistors or non-planar transistors such as FinFETs, nanowire transistors or nanoribbon transistors. Other possible design variations may include implementing the current mirror arrangements with reduced input impedance as single-ended input/output or differential input/output circuits, employing cascode arrangements of two or more transistors in any portions of the arrangements, etc. Some example implementations of current mirror arrangements with reduced input impedance are shown in FIGS. 3-6. However, any implementation of the current mirror arrangement with reduced input impedance in line with the descriptions provided herein is within the scope of the present disclosure.

A ratio of the output signal, provided at the output of the current mirror circuit, to the input signal, provided at the input of the current mirror circuit, may be substantially equal to K. K is a current gain, which may be any positive number greater than 0, where the exact value of K may, but does not have to be, an integer. For the bipolar implementation embodiments, the value of K may be indicative of (e.g., be equal to or be based on) a ratio of an area of the emitter of the output transistor Q2 to an area of the emitter of the input transistor Q1. For the MOS implementation embodiments, the value of K may be indicative of a ratio of the aspect ratio of the output transistor Q2 to the aspect ratio of the input transistor Q1, where an aspect ratio of a MOS transistor may be defined as a channel width of the transistor divided by its' channel length. In the embodiments where K is greater than 0 but less than 1, multiplying by a factor of K means reducing, or attenuating, the input signal to generate the output signal. In the embodiments where K is greater than 1, multiplying by a factor of K means increasing, or gaining, the input signal to generate the output signal.

In some embodiments, the current mirror circuit of any of the current mirror arrangements described herein may receive the input signal that is based on a bias current for the current mirror arrangement and a signal current. In some embodiments, current mirror arrangements with reduced input impedance may be implemented as single-ended arrangements. In other embodiments, the current mirror arrangements as described herein may be differential, in that a given arrangement may include two instances of the current mirror arrangement as described herein, which two instances may be substantially replicas of one another, differentiating from one another in the input current that each receives (and, therefore, in the output current that each produces). For example, the first instance of a given current mirror arrangement may receive an input signal in the form of a first input current $I_{INP}$ that is based on a sum of a bias current IB for the current mirror arrangement and a signal current $I_{IN}$ (e.g., $I_{INP}$=IB+$I_{IN}$), while the second instance of a given current mirror arrangement may receive the input signal in the form of a second input current $I_{INM}$ that is based on a difference between the bias current IB and the signal current $I_{IN}$ (e.g., $I_{INM}$=IB−$I_{IN}$). Thus, the first and second instances of a given current mirror arrangement may be seen as portions of a differential current mirror arrangement. In such embodiments, the output current of the first portion may be $I_{OP}$=K*$I_{INP}$, while the output current of the second portion may be $I_{OM}$=K*$I_{INM}$.

As will be appreciated by one skilled in the art, aspects of the present disclosure, in particular aspects of current mirror arrangements with reduced input impedance, as described herein, may be embodied in various manners—e.g., as a method or as a system. The following detailed description presents various descriptions of specific certain embodiments. However, the innovations described herein can be embodied in a multitude of different ways, for example, as defined and covered by the claims or select examples. For example, while some of the descriptions are provided herein with respect to either bipolar (e.g., NPN or PNP implementations) or MOS (e.g., NMOS or PMOS implementations) transistors, further embodiments of the current mirror arrangements described herein may include any combinations of bipolar and MOS transistors.

In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the numerous examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Basics of Current Mirrors

For purposes of illustrating current mirror arrangements with reduced input impedance realized by including a fast, low-gain loop and a slow, high-gain loop at the input transistor of a current mirror circuit, proposed herein, it might be useful to first understand phenomena that may come into play when current is mirrored. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides an electric circuit diagram of a simple single-ended NPN bipolar transistor implementation of a current mirror 100 with a current gain of K, as known in the art. As shown in FIG. 1, the current mirror 100 may include a first transistor Q1 (which may be referred to as an "input transistor") and a second transistor Q2 (which may be referred to as an "output transistor"). An input current 102 ($I_{IN}$) (i.e., the current to be mirrored at the output of the current mirror 100 to generate an output current 108) may be provided by an input current source 104. The current mirror 100 may first generate a control voltage (voltage VN1) at a feedback path 106 (node N1, labeled in FIG. 1) by placing the transistor Q1 in feedback to force the current at a collector terminal 110 (or, simply, "collector" 110) of the transistor Q1 to be equal to the input current 102. An emitter terminal 112 (or, simply, "emitter" 112) of the transistor Q1 may be connected to ground, as shown in FIG. 1. A base terminal 114 (or, simply, "base" 114) of the transistor Q1 may be coupled to a base 124 of the transistor Q2. The base 124 of the output transistor Q2 may be driven with the voltage VN1 carrying the input current information to generate the output current 108. FIG. 1 also indicates a collector 120 of the transistor Q2 and an emitter 122 of the transistor Q2, where the emitter 122 may be coupled to ground and where the output current 108 is the current at the collector 120, as shown in FIG. 1. When the emitter area of the transistor Q2 is K times larger than that of the transistor Q1, the output current 108 ($I_O$) may be equal to $K \cdot I_{IN}$.

The simplified model of a bipolar transistor collector current is given by $$I_C = AI_S \exp\left(\frac{V_{BE}}{V_t}\right)$$

where $I_C$, A, $I_S$, $V_{BE}$ and $V_t$ are collector current, emitter area, unit area saturation current, the base-emitter voltage and thermal voltage, respectively. Although the relation between collector current ($I_C$) to base-emitter voltage ($V_{BE}$), or, equivalently input current $I_{IN}$ and VN1, is strongly nonlinear, the input-output current mirroring relation is linear, i.e. $I_O = K \cdot I_{IN}$.

The basic analysis given above has many shortcomings in understanding the performance degradation of current mirrors at high operating frequencies. FIG. 2 provides an electric circuit diagram of an NPN implementation of a current mirror 200. The current mirror 200 is substantially the same as the current mirror circuit 100 of FIG. 1, except that it additionally illustrates relevant parasitic components for high operating frequencies. In other words, FIG. 2 illustrates important parasitic devices that may degrade the bandwidth and the linearity of the circuit 100. It is to be understood that parasitic components shown in the present drawings and discussed herein refer to components which are not deliberately fabricated in a circuit, but, rather, electric circuit diagram representations of inadvertent effects or behavior that may be exhibited by a circuit.

Elements of FIG. 2 having reference numerals shown in FIG. 1 are intended to illustrate the same or analogous elements as those described with respect to FIG. 1, so that, in the interest of brevity, their descriptions are not repeated. This is applicable to other figures of the present disclosure—elements with reference numerals described with reference to one figure may be the same as, or analogous to, elements with the same reference numerals shown in another figure, so that descriptions provided for one figure are applicable to the other figure and don't have to be repeated.

The current mirror 200 may be affected by one of more of a parasitic capacitance 216, a parasitic capacitance 218, a parasitic capacitance 220, a parasitic capacitance 228, and a resistance 224 (which may be used to convert the output current of the current mirror to voltage), each of which may be coupled as shown in FIG. 2.

The parasitic capacitance 216 may represents all routing parasitic capacitances associated with the node 106, parasitic capacitance of 104 input current source loading node 106, as well as collector-substrate capacitance and extrinsic base terminal parasitic capacitors of the transistors Q1 and Q2. Note that the modern SOI process based bipolar transistor collector-substrate capacitor is relatively small and can be treated as being linear. The parasitic capacitance 218 may represent the intrinsic base-emitter forward-bias diffusion capacitance of the transistor Q1. The parasitic capacitance 220 may represent the intrinsic base-emitter forward-bias diffusion capacitance of the transistor Q2 (and may be K times larger than the parasitic capacitance 218 if the emitter area of the transistor Q2 is K times larger than that of the transistor Q1). The parasitic capacitance 228 may represent the intrinsic base-collector junction parasitic capacitance of the transistor Q2. The resistance 224 may represent an output resistance (RO) of the current mirror 100/200.

Inventors of the present disclosure realized that, as can be seen from the analysis of the circuit in FIG. 2, three distinct mechanisms degrading the bandwidth and/or the linearity of the current mirror may be identified for bipolar transistor implementations. One is bandwidth degradation due to the parasitic capacitors. Another one is linearity degradation due to nonlinearity of the intrinsic base-collector junction parasitic capacitance (e.g., the parasitic capacitance 228, shown in FIG. 2). The third one is linearity degradation due to linear parasitic capacitance 216. Similarly, a number of linearity degradation mechanisms may be identified for MOS transistor implementations of current mirror circuits. One degradation mechanism for the MOS implementations is bandwidth degradation due to the parasitic capacitors, similar to the bipolar implementations. Another one is linearity degradation due to linear capacitive load on node 106. The third one is linearity degradation due to gate-drain capacitance $C_{GD}$. Inventors of the present disclosure further realized that improving on at least some of these degradation mechanisms could provide an improvement in terms of designing linear broadband current mirrors.

Reducing Input Impedance in Current Mirror Arrangements

In general, different techniques may be implemented to improve on one or more of the problems described above, where some tradeoffs may have to be made, e.g., in trading performance with complexity. As the foregoing illustrates, the current of any capacitor loading the node N1 can modulate the input current 102 with the nonlinear N1 node voltage. Some of the loading capacitors, e.g. bipolar base-emitter parasitic capacitors 218 and 220, may have the "right" amount of nonlinearity in that their currents become linear when combined with the nonlinear N1 node voltage. All the other capacitors on the node N1, e.g., the parasitic capacitance 216, may result in nonlinear modulation of the input current 102 and degrade the linearity performance.

Figure 3:
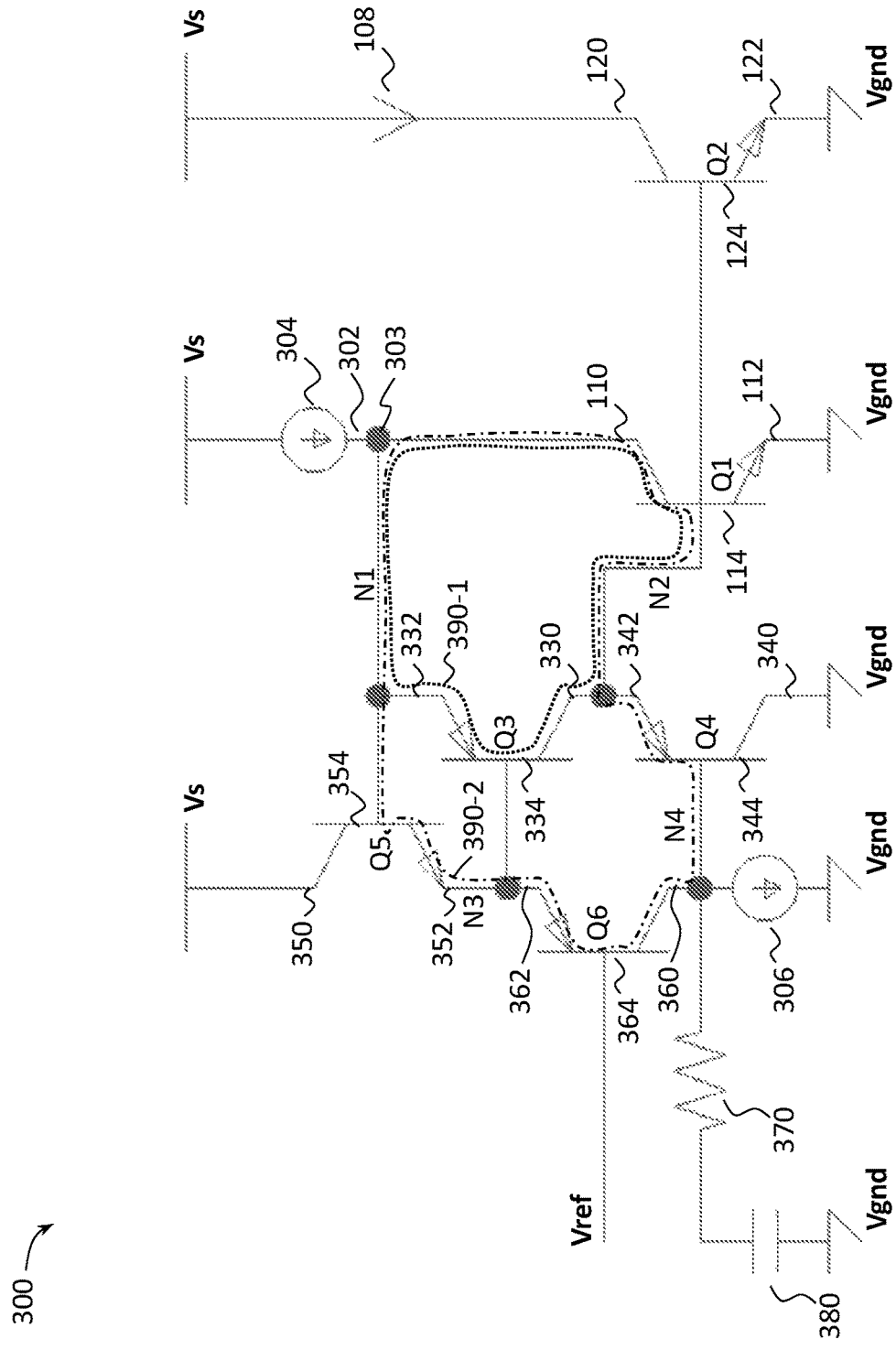
FIGS. 3-6 provide electric circuit diagrams of current mirror arrangements with reduced input impedance, according to various embodiments of the disclosure.

Besides careful device sizing and layout to minimize such undesired capacitors on the node N1, it is possible to modify the input side of the current mirror circuit to reduce its impedance or, equivalently, reduce the N1 voltage swing. However, inventors of the present disclosure realized that straight-forward solutions to reduce the input impedance often result in creation of other problems that compromise the overall performance. For example, adding only a transistor Q3 as shown in FIG. 3, with the first terminal of the transistor Q3 being coupled to a reference voltage Vref and with the second terminal of the transistor Q3 being coupled to a bias current (IB) and the first terminal of the transistor Q1, may reduce the impedance on the node N1, but introduces another high-impedance now, i.e., node N2 (labeled in FIG. 3), having nonlinear voltage. Consequently, any capacitor loading the node N2 is modulated with the nonlinear voltage on the node N2, the resulting nonlinear current reaches to the input node N1 through the transistor Q3 and modulates the input current. Other solutions may result in low DC feedback gain, feedback currents that depend on input currents, and low mirroring ratio.

Embodiments of the present disclosure are based on recognition that forming two feedback paths, with the input transistor Q1 closing each of the feedback paths to form respective loops, may provide improvements on at least some of the challenges described above. One example implementation of a current mirror arrangement with two such loops is shown in FIG. 3.

FIG. 3 provides an electric circuit diagram of a current mirror arrangement 300 with reduced input impedance, according to some embodiments of the disclosure. As shown in FIG. 3, the arrangement 300 includes a current mirror circuit formed of the input transistor Q1 and the output transistor Q2, as described above. The current mirror arrangement 300 is configured to receive an input current 302 (IB1+$I_{IN}$) from a current source 304, e.g., at the input to the current mirror formed by the transistors Q1 and Q2 (e.g., at a node 303), of which the second terminal 110 current of the input transistor Q1 is equal to $I_{IN}$. Thus, the current source 304 may provide the bias current IB1 for the Q3 and Q4 current path, which bias current may be set before. The bias current IB1 is the emitter current of the transistor Q3 and is substantially constant. Under such configuration, the collector current of Q1 (i.e., the current received at the second terminal 110 of the input transistor Q1) may be substantially equal to $I_{IN}$ because the portion IB1 of the original input current 302 is subtracted through the emitter connection of the transistor Q3. The current $I_{IN}$ is a time-varying input current of the transistor Q1 that is mirrored by the current mirror to generate a mirrored current ($I_O$) 108, e.g., at an output of the current mirror formed by the transistors Q1 and Q2 (e.g., at the second terminal 120 of the output transistor Q2). The relation between input and output currents is $I_O=K*I_{IN}$, where K is a number greater than 0 (which value may, but does not have to be, an integer), indicative of a ratio of an area of the emitter of the transistor Q2 to an area of the emitter of the transistor Q1. In some implementations, the input current $I_{IN}$ is always positive and, in practice, does not reach to zero in order to keep the circuit biased. Having to provide the bias current portion IB1 in the input current 302 differentiates this input current from the input current 102 of conventional implementations (i.e., in conventional current mirrors there is no need for an extra bias current provided as a part of the input current for the current mirror).

In contrast to the conventional current mirror implementation as shown in FIGS. 1-2, the feedback path from the first terminal 114 to the second terminal 110 of the transistor Q1 is modified by introducing what may be referred to as a "transistor matrix," i.e., a plurality of additional transistors. In some embodiments, the plurality of additional transistors may include transistors Q3-Q6, as shown in FIG. 3. In particular, together with the input transistor Q1, a first sub-set of the plurality of transistors Q3-Q6 may form a first loop 390-1, shown in FIG. 3 with a dotted line, while a second sub-set of the plurality of transistor Q3-Q6 may form a second loop 390-2, shown in FIG. 3 with a dashed-dotted line. As shown in FIG. 3, the first loop 390-1 may include the input transistor Q1 and the transistor Q3, while the second loop 390-2 may include the input transistor Q1, and the transistors Q5, Q6, and Q4. More specifically, the first loop 390-1 may include the following electrical path: the first terminal 114 of the transistor Q1, the second terminal 110 of the transistor Q1, the third terminal 332 of the transistor Q3, and, finally, the second terminal 330 of the transistor Q3, coupled to the first terminal 114 of the transistor Q1, thus completing the first loop 390-1. The second loop 390-2 may include the following electrical path: the first terminal 114 of the transistor Q1, the second terminal 110 of the transistor Q1, the first terminal 354 of the transistor Q5, the third terminal 352 of the transistor Q5, the third terminal 362 of the transistor Q6, the second terminal 360 of the transistor Q6, the first terminal 344 of the transistor Q4, and, finally, the third terminal 342 of the transistor Q4, coupled to the first terminal 114 of the transistor Q1, thus completing the second loop 390-2.

The first loop 390-1 may be a low-gain loop while the second loop 390-2 may be a high-gain loop because these loops may be designed so that the gain of the first loop 390-1 is lower than the gain of the second loop 390-2. Furthermore, the first loop 390-1 may be a fast loop while the second loop 390-2 may be a slow loop because, the first loop 390-1 is dominant at the higher frequencies of the input current 302 (e.g., of the portion $I_{IN}$ of the input current 302), while the second loop 390-2 is dominant at the lower frequencies of the input current 302 (e.g., of the portion $I_{IN}$ of the input current 302). Because the second loop 390-2 encloses the first loop 390-1, the second loop may be referred to as an "outer" loop, while the first loop may be referred to as an "inner" loop.

The transistors Q5 and Q6 form the high-gain second loop 390-2. Since the transistor Q1 is closing the feedback by inverting its input, the signal polarity of the high-gain path of the second loop 390-2 may be designed to be positive when the output of the high-gain path reaches the first terminal 114 of the transistor Q1 to maintain negative feedback. As shown in FIG. 3, a reference voltage Vref may be applied to the first terminal 364 of the transistor Q6, while the bias current (IB) 306 may be applied at the second terminal 360 of the transistor Q6 and the first terminal 344 of the transistor Q4. The bias current 306, together with the reference voltage Vref, may be configured to set the quiescent voltage levels on nodes N1 and N3 (N3 being the node coupling the third terminal 352 of the transistor Q5 and the third terminal of the transistor Q6). Since quiescent N1 and N3 voltages are set, the quiescent bias current of the transistor Q3 is also set. The Q3 bias current can be tuned to the desired level, e.g., to the bias current IB1, described above as being provided as a portion of the input current 302 (i.e., the bias current IB1 is different from the bias current IB 306), by properly choosing the emitter area ratio of Q5 and Q3. Phrased differently, the bias current IB1 of the transistor Q3 may be determined with respect to the emitter area ratio of Q5 and Q3 and the bias current IB 306.

The transistor Q4 may have dual roles. On one hand, it may function as a diode load to the fast inner loop 390-1, which may reduce node N2 impedance and linearize the emitter current of the transistor Q3. On the other hand, it may function as a unity gain buffer (or, simply, a "buffer," also known as a unity gain amplifier, a buffer amplifier, a voltage follower, or an isolation amplifier) for the high-gain outer loop 390-2. The transistor Q4 effectively sums the signals in the inner loop 390-1 and the outer loop 390-2 on the node N2 to drive the input transistor Q1 (i.e., by applying the sum of the signals of the inner loop 390-1 and the outer loop 390-2 to the first terminal 114 of the input transistor Q1).

Since the first loop 390-1 only has 2 nodes, it is substantially unconditionally stable. Because the second loop 390-2 has more nodes, in some embodiments, a compensation capacitor 380 and, optionally, a resistor 370 may be coupled to the second loop 390-2 to stabilize the loop. For example, if the resistor 370 is used (which may be advantageous in terms of improving the bandwidth even further), the first terminal of the resistor 370 may be coupled to the first terminal 344 of the transistor Q4 and the second terminal 360 of the transistor Q6 (i.e., to the node N4), while the second terminal of the resistor 370 may be coupled to the ground potential (labeled in FIG. 3 as "Vgnd"), via the compensation capacitor 380. When the resistor 370 is used, the first capacitor electrode of the compensation capacitor 380 may be coupled to the second terminal of the resistor 370, while the second capacitor electrode of the compensation capacitor 380 may be coupled to Vgnd. When the resistor 370 is not used, the first capacitor electrode of the compensation capacitor 380 may be coupled to the first terminal 344 of the transistor Q4 and the second terminal 360 of the transistor Q6 (i.e., to the node N4), while the second capacitor electrode of the compensation capacitor 380 may be coupled to Vgnd. In some embodiments, the value of the resistor 370 may be based on the transconductance of the transistor Q4 (i.e., gm(Q4)), e.g., the value of the resistor may be substantially equal to 1/gm(Q4). The size of the capacitor 380 (and, hence, the capacitance of the capacitor 380) may be selected to achieve the desired loop phase margin.

For the current mirror arrangement 300, at relatively low input frequencies, the high-gain second loop 390-2 may be configured to properly bias and accurately generate N2 node voltage (i.e., voltage at the first terminal 114 of the input transistor Q1), while at higher input frequencies the fast first loop 390-1 may extend the linear operating frequency band. Thus, at lower frequencies of the input signal 302 (e.g., of the current portion $I_{IN}$ of the input current 302), the loop gain of the arrangement 300 may be defined by the gain of the high-gain loop (i.e., the second loop 390-2). As the frequency of the input signal 302 (e.g., of the current portion $I_{IN}$ of the input current 302) is increased, at some point the compensation capacitor 380 becomes activated and the loop gain of the arrangement 300 is decreased until the loop gain is defined by the gain of the low-gain loop (i.e., the first loop 390-1). The node N4 may be a high-impedance node, the node N3 may have impedance lower than that of N4, and, by including the two loops 390-1 and 390-2, the nodes N1 and N2 may advantageously become relatively low-impedance nodes, substantially free of the effects of the parasitic capacitance.

The current mirror arrangement 300 illustrates an example of a current mirror arrangement with reduced input impedance where the transistors Q1, Q2, and Q5 are implemented as NPN transistors, while the transistors Q3, Q4, and Q6 are implemented as PNP transistors. Such an implementation may be advantageous in terms of increasing the linear operation bandwidth offered by the current mirror arrangements described herein.

To summarize some aspects of the current mirror arrangement 300 shown in FIG. 3, where, again, all base terminals of the bipolar transistors shown in FIG. 3 are referred to as "first terminals," all collector terminals of the bipolar transistors shown in FIG. 3 are referred to as "second terminals," and all emitter terminals of the bipolar transistors shown in FIG. 3 are referred to as "third terminals," then the following holds. The current mirror arrangement 300 includes a current mirror circuit that includes an input transistor Q1 and an output transistor Q2. The current mirror arrangement 300 is configured to receive an input, the input current 302, equal to IB1+$I_{IN}$, as the input for the second terminal of the input transistor Q1 and the third terminal of the transistor Q3. The current IB1 is a constant bias current of the transistor Q3, set with respect to the bias current IB 306 (applied at the second terminal 360 of the transistor Q6 and the first terminal 344 of the transistor Q4) and the emitter area ratio of the transistors Q5 and Q3 when the transistors Q5 and Q3 are bipolar transistors, or the aspect ratio of the transistor Q5 to the aspect ratio of the transistor Q3 when the transistors Q5 and Q3 are MOS transistors, where an aspect ratio of a MOS transistor is defined as a channel width divided by a channel length. The portion IB1 of the input current 302 is effectively subtracted by the transistor Q3, and substantially only the portion $I_{IN}$ of the input current 302 is then received at the second terminal 110 of the input transistor Q1. The current mirror arrangement 300 is configured to provide a current, the output current 108, that is mirrored with a factor K with respect to the input current portion received by the second terminal 110 of the input transistor Q1, i.e., with respect to the input current $I_{IN}$. For example, the current mirror arrangement 300 may generate the output current $I_O=K*I_{IN}$, where K is indicative of a ratio of an area of the emitter of the transistor Q2 to an area of an emitter of the transistor Q1. The first terminal 114 of the transistor Q1 may be coupled to the first terminal 124 of the transistor Q2. Because the transistor Q1 of the current mirror arrangement 300 is an N-type transistor, its third terminal 112 may be coupled to the ground potential (labeled in the present drawings as "Vgnd"), while its second terminal 110 may be coupled to the input current 302, which may be provided by the current source 304, coupled to the supply voltage (labeled in the present drawings as "Vs"). Because the transistor Q2 of the current mirror arrangement 300 is also an N-type transistor, its third terminal 122 may be coupled to the ground potential, while its second terminal 120 may be coupled to the supply voltage. The current mirror arrangement 300 further includes a transistor matrix that includes transistors Q3-Q6. The second terminal 110 of the transistor Q1 may be coupled to each of the third terminal 332 of the transistor Q3 and the first terminal 354 of the transistor Q5. The third terminal 352 of the transistor Q5 may be coupled to the third terminal 362 of the transistor Q6. The first terminal 364 of the transistor Q6 may be coupled to the reference voltage. The second terminal 360 of the transistor Q6 may be coupled to the first terminal 344 of the transistor Q4. The first capacitor electrode of the compensation capacitor 380 may be coupled to each of the second terminal 360 of the transistor Q6 and the first terminal 344 of the transistor Q4, possibly via the resistor 370, while the second capacitor electrode of the compensation capacitor 380 may be coupled to the ground potential. The third terminal 342 of the transistor Q4 may be coupled to each of the second terminal 330 of the transistor Q3 and the first terminal 114 of the transistor Q1, or, phrased differently, the first terminal 114 of the transistor Q1 may be coupled to each of the second terminal 330 of the transistor Q3 and the third terminal 342 of the transistor Q4. The first terminal 334 of the transistor Q3 may be coupled to each of the third terminal 352 of the transistor Q5 and the third terminal 362 of the transistor Q6. Because the transistor Q5 of the current mirror arrangement 300 is an N-type transistor, its second terminal 350 may be coupled to the supply voltage. Because the transistor Q4 of the current mirror arrangement 300 is a P-type transistor, its second terminal 340 may be coupled to the ground potential. The bias current source 306 may be coupled between the ground potential and each of the first terminal 344 of the transistor Q4 and the second terminal 360 of the transistor Q6.

Figure 4:
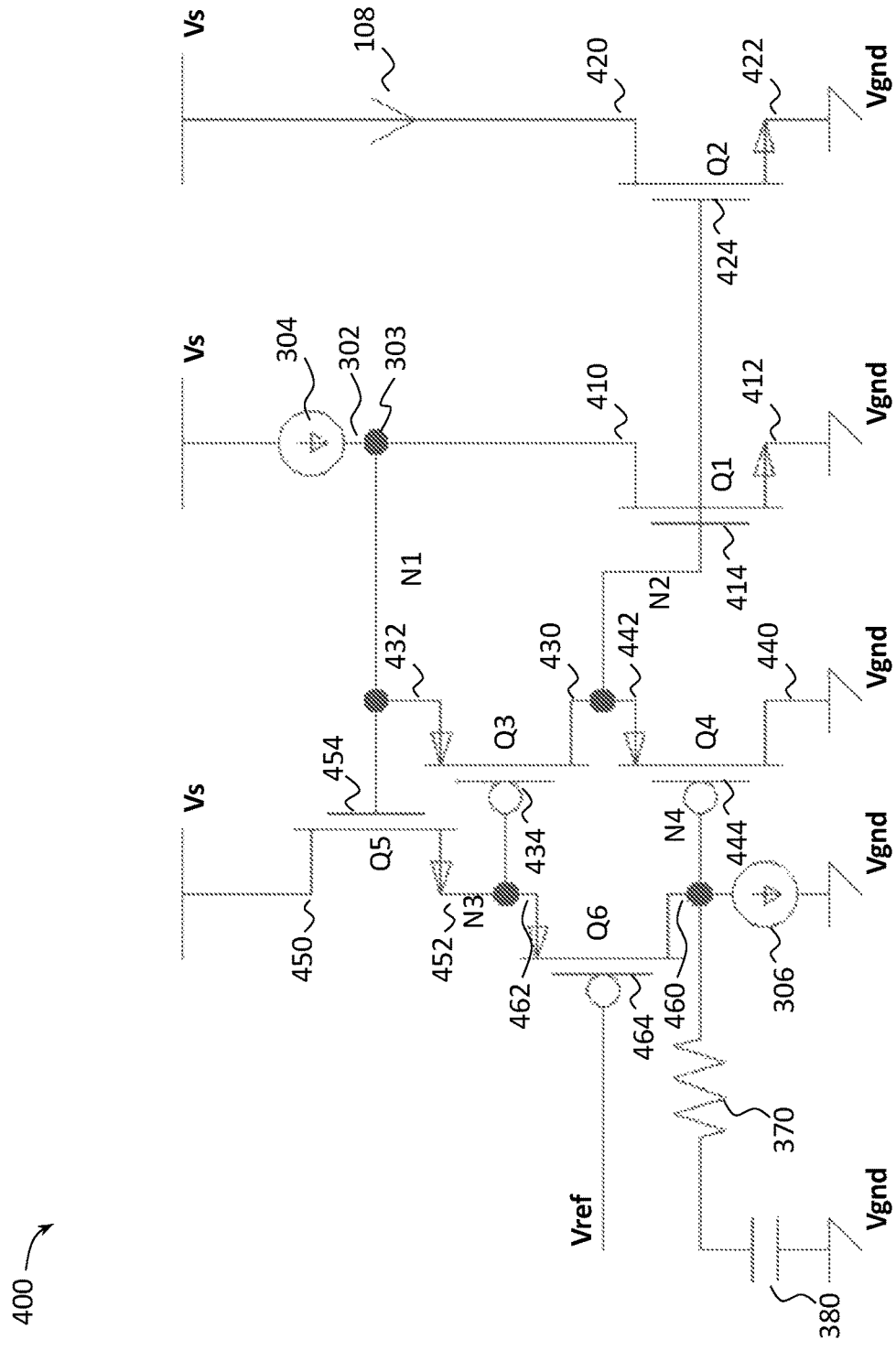

While the descriptions provided above refer to the bipolar implementation of the transistors, in other embodiments, a current mirror arrangement may include transistors implemented in as FETs, e.g., implemented in MOS technology. In particular, FIG. 4 provides an electric circuit diagram of a MOS implementation of a current mirror arrangement 400 with reduced input impedance, according to some embodiments of the disclosure, where transistors Q1, Q2, and Q5 are implemented as NMOS transistors, while the transistors Q3, Q4, and Q6 are implemented as PMOS transistors. The current mirror arrangement 400 is substantially analogous to the current mirror arrangement 300 except that each NPN transistor of the current mirror arrangement 300 (i.e., transistors Q1, Q2, and Q5) is replaced with an NMOS transistor in the current mirror arrangement 400, and each PNP transistor of the current mirror arrangement 300 (i.e., transistors Q3, Q4, and Q6) is replaced with a PMOS transistor in the current mirror arrangement 400. In such a configuration, the descriptions provided with reference to FIG. 3 are applicable except that the "first terminals" or "base terminals" of the bipolar transistors become "gate terminals" for the MOS transistors of the current mirror arrangement 400 FIG. 4, the "second terminals" or "collector terminals" of the bipolar transistors become "drain terminals" for the MOS transistors of the current mirror arrangement 400 FIG. 4, and the "third terminals" or "emitter terminals" of the bipolar transistors become "source terminals" for the MOS transistors of the current mirror arrangement 400 FIG. 4. In contrast to the bipolar implementation, for the MOS implementation of the current mirror arrangement 400, K is a value indicative of a ratio of the aspect ratio of the transistor Q2 to the aspect ratio of the transistor Q1. The reference numerals 110, 112, 114, 120, 122, 124 indicating the transistor terminals of the transistors Q1 and Q2 in FIG. 3 may be replaced, respectively, with reference numerals 410, 412, 414, 420, 422, 424 for the transistors Q1 and Q2 of the current mirror arrangement 400 of FIG. 4. Similarly, the reference numerals 330, 332, 334, 340, 342, 344, 350, 352, 354, 360, 362, and 364, indicating the transistor terminals of the transistors Q3, Q4, Q5, and Q6 in FIG. 3 may be replaced, respectively, with reference numerals 430, 432, 434, 440, 442, 444, 450, 452, 454, 460, 462, and 464 for the transistors Q3-Q6 of the current mirror arrangement 400 of FIG. 4. In the interests of brevity, a detailed description of FIG. 4 is not provided because it's substantially analogous to that of FIG. 3 except for the changes identified above.

Further variations to the current mirror arrangements with reduced input impedance are possible. In particular, while the descriptions of FIGS. 3 and 4, provided above, refer to the N-type implementation of the transistors Q1, Q2, and Q5 and the P-type implementation of the transistors Q3, Q4, and Q6, in other embodiments, the transistors Q1, Q2, and Q5 may be implemented as P-type transistors, while the transistors Q3, Q4, and Q6 may be implemented as N-type transistors, some examples of which are shown in FIGS. 5 and 6.

Figure 5:
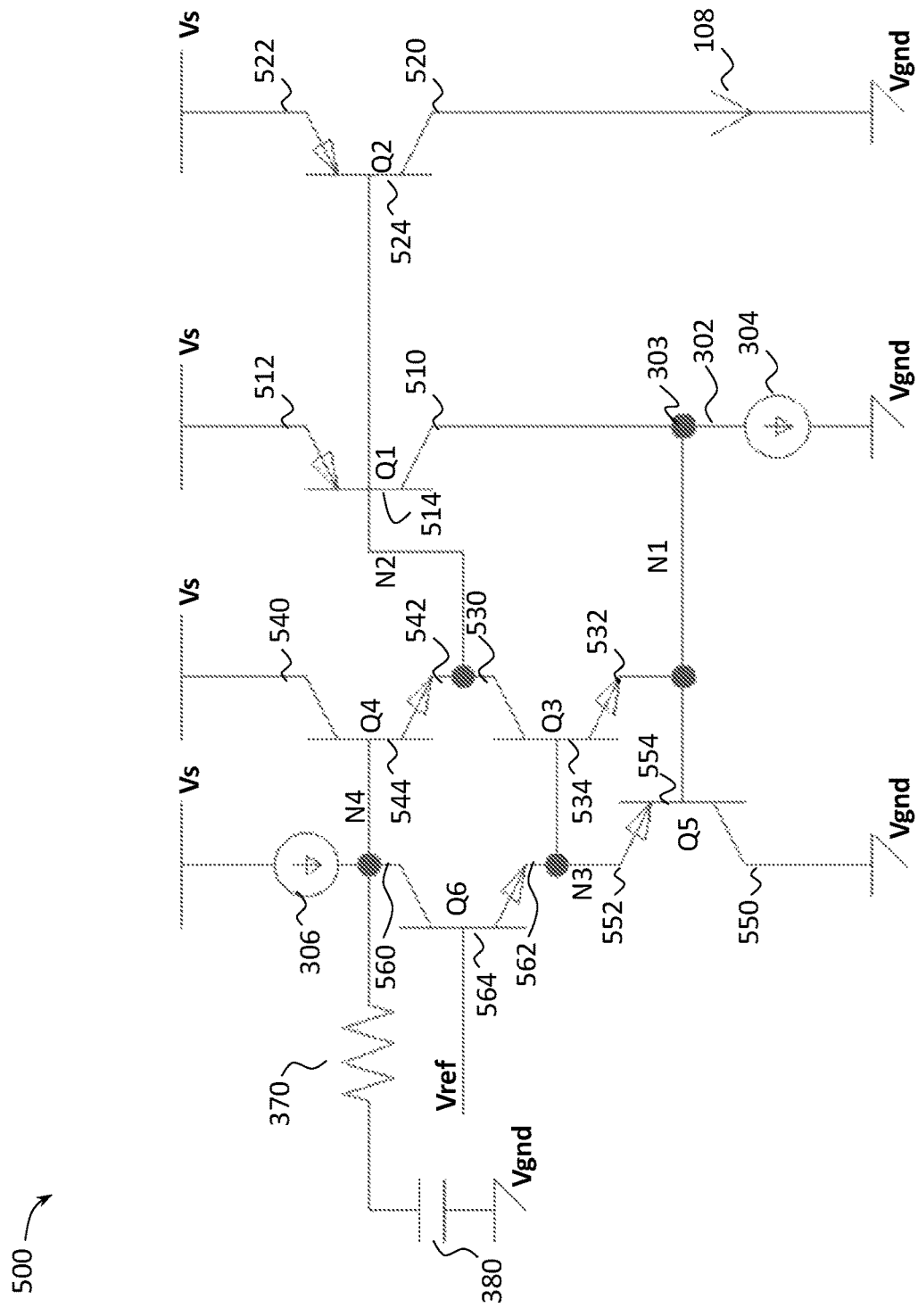

FIG. 5 provides an electric circuit diagram of a current mirror arrangement 500 with reduced input impedance, according to some embodiments of the disclosure. The arrangement 500 may be seen as the second example of a bipolar implementation (the first example being that of FIG. 3), where transistors Q1, Q2, and Q5 are implemented as PNP transistors, while the transistors Q3, Q4, and Q6 are implemented as NPN transistors. The current mirror arrangement 500 is substantially analogous to the current mirror arrangement 300 except that each NPN transistor of the current mirror arrangement 300 (i.e., transistors Q1, Q2, and Q5) is replaced with a PNP transistor in the current mirror arrangement 500, and each PNP transistor of the current mirror arrangement 300 (i.e., transistors Q3, Q4, and Q6) is replaced with an NPN transistor in the current mirror arrangement 500. In such a configuration, the descriptions provided with reference to FIG. 3 are applicable to the current mirror arrangement 500 except that NPN and PNP transistors are swapped, and supply and current directions are reversed (i.e., the designations of the supply voltage Vs and the ground voltage Vgnd are reversed in FIG. 5, compared to FIG. 3, except for the second terminal of the capacitor 380 still being coupled to ground in the arrangement 500). In FIG. 5, the designations such as "first/base terminals," "second/collector terminals," and "third/emitter terminals" remain the same. The reference numerals 110, 112, 114, 120, 122, 124 indicating the transistor terminals of the transistors Q1 and Q2 in FIG. 3 may be replaced, respectively, with reference numerals 510, 512, 514, 520, 522, 524 for the transistors Q1 and Q2 of the current mirror arrangement 500 of FIG. 5. Similarly, the reference numerals 330, 332, 334, 340, 342, 344, 350, 352, 354, 360, 362, and 364, indicating the transistor terminals of the transistors Q3, Q4, Q5, and Q6 in FIG. 3 may be replaced, respectively, with reference numerals 530, 532, 534, 540, 542, 544, 550, 552, 554, 560, 562, and 564 for the transistors Q3-Q6 of the current mirror arrangement 500 of FIG. 5. In the interests of brevity, a detailed description of FIG. 5 is not provided because it's substantially analogous to that of FIG. 3 except for the changes identified above.

Figure 6:
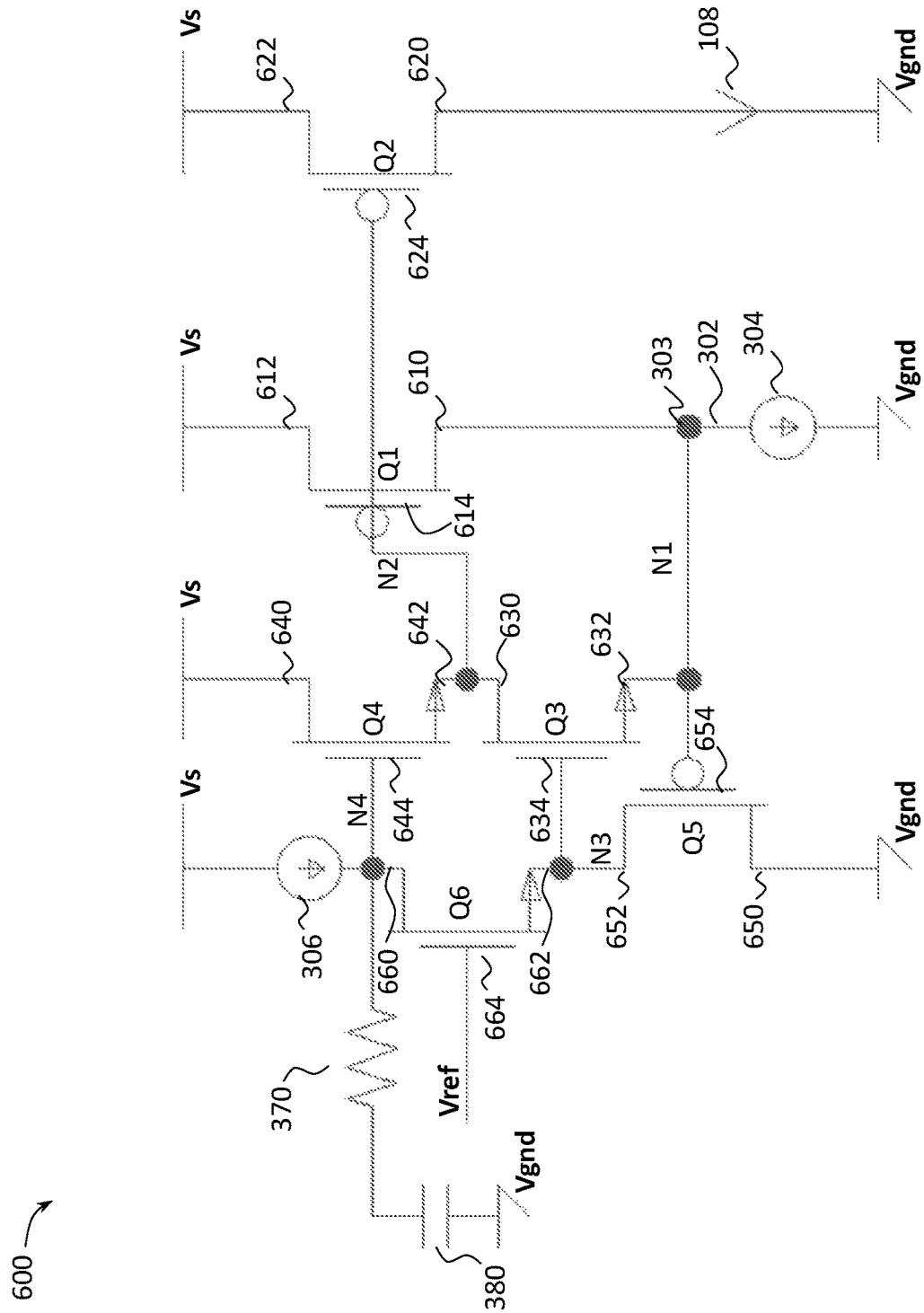

In yet another embodiment, the PNP transistors Q1, Q2, and Q5 of the current mirror arrangement 500 may be replaced with PMOS transistors, while the NPN transistors Q3, Q4, and Q6 of the current mirror arrangement 500 may be replaced with NMOS transistors, as shown with a current mirror arrangement 600 of FIG. 6. In particular, FIG. 6 provides an electric circuit diagram of a CMOS implementation of a current mirror arrangement 600 with reduced input impedance, according to some embodiments of the disclosure. The arrangement 600 may be seen as the second example of a CMOS implementation (the first example being that of FIG. 4), where transistors Q1, Q2, and Q5 are implemented as PMOS transistors, while the transistors Q3, Q4, and Q6 are implemented as NMOS transistors. The current mirror arrangement 600 is substantially analogous to the current mirror arrangement 500 except that each NPN transistor of the current mirror arrangement 500 (i.e., transistors Q3, Q4, and Q6) is replaced with an NMOS transistor in the current mirror arrangement 600, and each PNP transistor of the current mirror arrangement 500 (i.e., transistors Q1, Q2, and Q5) is replaced with an PMOS transistor in the current mirror arrangement 600. In such a configuration, the descriptions provided with reference to FIG. 5 are applicable except that the "first terminals" or "base terminals" of the bipolar transistors become "gate terminals" for the MOS transistors of the current mirror arrangement 600 FIG. 6, the "second terminals" or "collector terminals" of the bipolar transistors become "drain terminals" for the MOS transistors of the current mirror arrangement 600 FIG. 6, and the "third terminals" or "emitter terminals" of the bipolar transistors become "source terminals" for the MOS transistors of the current mirror arrangement 600 FIG. 6. In contrast to the bipolar implementation shown in FIG. 5, for the MOS implementation of the current mirror arrangement 600, K is a value indicative of a ratio of the aspect ratio of the transistor Q2 to the aspect ratio of the transistor Q1. The reference numerals 510, 512, 514, 520, 522, 524, 530, 532, 534, 540, 542, 544, 550, 552, 554, 560, 562, and 564, indicating the transistor terminals of the transistors Q1-Q6 in FIG. 5 may be replaced, respectively, with reference numerals 610, 612, 614, 620, 622, 624, 630, 632, 634, 640, 642, 644, 650, 652, 654, 660, 662, and 664 for the transistors Q1-Q6 of the current mirror arrangement 600 of FIG. 6. In the interests of brevity, a detailed description of FIG. 6 is not provided because it's substantially analogous to that of FIG. 5 except for the changes identified above.

Still further variations to the current mirror arrangements with reduced input impedance are possible.

In one example, in some embodiments, a current mirror arrangement with N-type transistors Q1, Q2, and Q5 (e.g., a current mirror arrangement similar to the current mirror arrangements 300 or 400) may include a combination of NPN and NMOS transistors (i.e., one or more of the transistors Q1, Q2, and Q5 may be implemented as NPN transistors, while one or more of the transistors Q1, Q2, and Q5 may be implemented NMOS transistors). Additionally or alternatively to these embodiments, a current mirror arrangement with P-type transistors Q3, Q4, and Q6 (e.g., a current mirror arrangement similar to the current mirror arrangements 300 or 400) may include a combination of PNP and PMOS transistors (i.e., one or more of the transistors Q3, Q4, and Q6 may be implemented as PNP transistors, while one or more of the transistors Q3, Q4, and Q6 may be implemented PMOS transistors).

Similarly, in another example, in some embodiments, a current mirror arrangement with P-type transistors Q1, Q2, and Q5 (e.g., a current mirror arrangement similar to the current mirror arrangements 500 or 600) may include a combination of PNP and PMOS transistors (i.e., one or more of the transistors Q1, Q2, and Q5 may be implemented as PNP transistors, while one or more of the transistors Q1, Q2, and Q5 may be implemented PMOS transistors). Additionally or alternatively to these embodiments, a current mirror arrangement with N-type transistors Q3, Q4, and Q6 (e.g., a current mirror arrangement similar to the current mirror arrangements 500 or 600) may include a combination of NPN and NMOS transistors (i.e., one or more of the transistors Q3, Q4, and Q6 may be implemented as NPN transistors, while one or more of the transistors Q3, Q4, and Q6 may be implemented NMOS transistors).

Example Systems with Current Mirror Arrangements with Reduced Input Impedance

Figure 7:
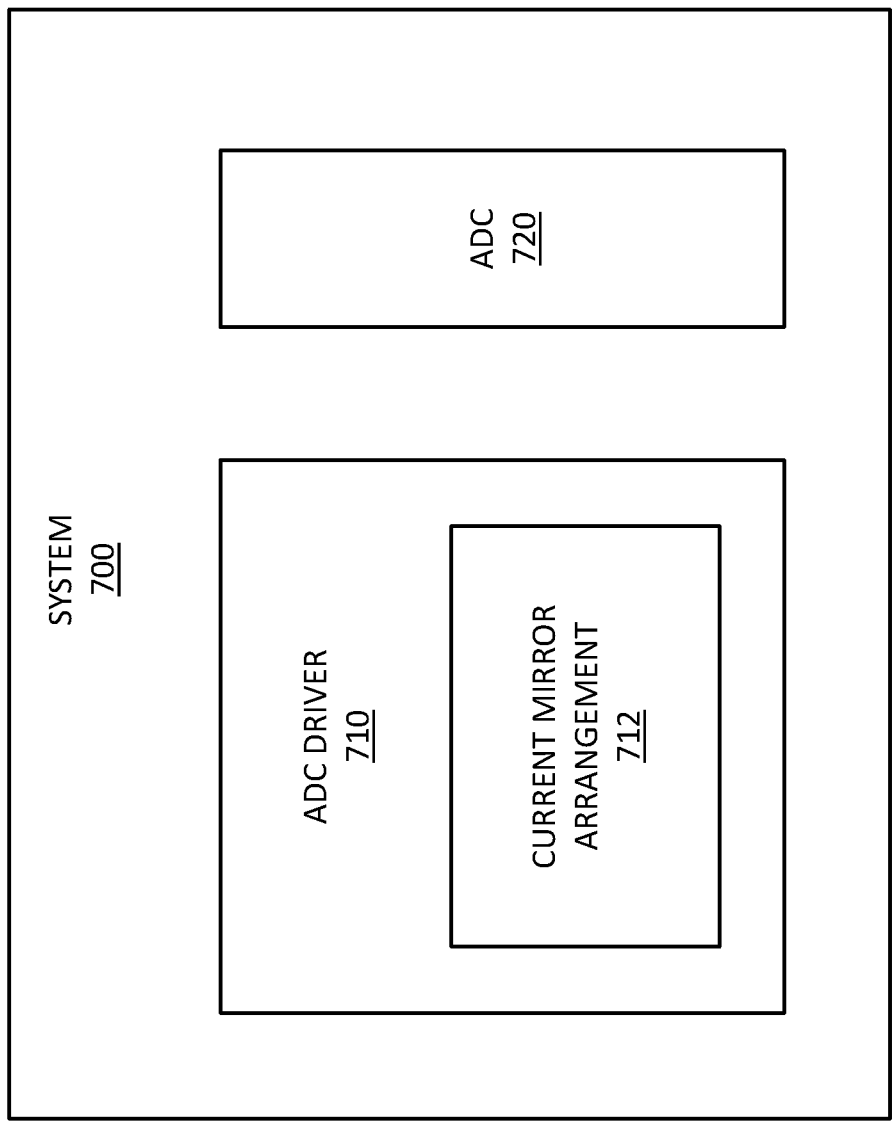
FIG. 7 provides a schematic illustration of a system implementing a current mirror arrangement with reduced input impedance, according to some embodiments of the disclosure.

Various embodiments of current mirror arrangements with reduced input impedance as described above may be implemented in any kind of system where current mirroring may be used. Such current mirror arrangements may be particularly useful in systems where current mirrors having both high linearity and wide signal bandwidth are needed. One example of such a system is shown in FIG. 7, providing a schematic illustration of a system 700 implementing a current mirror arrangement 712, according to some embodiments of the disclosure. As shown in FIG. 7, the system 700 may include an analog-to-digital converter (ADC) driver 710 and an ADC 720. The ADC driver 710 may be used to provide drive signals to drive the ADC 720 so that the ADC 720 can translate analog electrical signals to digital form, e.g., for data processing purposes. In particular, the ADC driver 710 may include the current mirror arrangement 712 which can be implemented according to any embodiments of current mirror arrangements with reduced input impedance, described above. For example, the current mirror arrangement 712 may be implemented as the current mirror arrangement 300, 400, 500, or 600, or as any further embodiments of these current mirror arrangements, as described above. The ADC driver 710 may then generate drive signals based on the output signal(s) generated by the current mirror arrangement 712. In various embodiments, the drive signals generated by the ADC driver 710 may be used to drive a single or dual differential input of the ADC 720.

In various embodiments, the drive signal generated by the ADC driver 710 may realize/implement functions such as buffering, amplitude scaling, single-ended-to-differential and differential-to-single-ended conversion, common-mode offset adjustment, and filtering. In other words, the ADC driver 710 may act as a signal conditioning element in a data conversion stage and may be a key factor in enabling the ADC 720 to achieve its desired performance. The ADC 720 may be any type of ADC, such as, but not limited to, a successive approximation register (SAR) converter, a pipeline converter, a flash converter, or a sigma-delta converter.

The system 700 shown in FIG. 7 provides just one non-limiting example where current mirror arrangements as described herein may be used and various teachings related to current mirror arrangements with reduced input impedance as described herein are applicable to a large variety of other systems. In some scenarios, various embodiments of current mirror arrangements with reduced input impedance as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of current mirror arrangements with reduced input impedance as described herein can be used in the industrial markets that include process control systems that help drive productivity, energy efficiency, and reliability. In yet further scenarios, various embodiments of current mirror arrangements with reduced input impedance may be used in consumer applications.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure related to current mirror arrangements with reduced input impedance may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of current mirror arrangements with reduced input impedance, proposed herein, may be implemented in one or more silicon cores in Application Specific Integrated Circuits (ASICs), Field Programmable Gate Arrays (FPGAs), and other semiconductor chips.

Select Examples

The following paragraphs provide examples of various ones of the embodiments disclosed herein.

Example 1 provides a current mirror arrangement that includes a plurality of transistors, each transistor having a first terminal, a second terminal, and a third terminal. The plurality of transistors includes at least transistors Q1, Q2, Q3, and Q4, arranged so that the first terminal of the transistor Q1 is coupled to the first terminal of the transistor Q2, the second terminal of the transistor Q1 is coupled to the third terminal of the transistor Q3, and the first terminal of the transistor Q1 is further coupled to each of the second terminal of the transistor Q3 and the third terminal of the transistor Q4.

Example 2 provides the current mirror arrangement according to example 1, where the second terminal of the transistor Q3 is coupled to the third terminal of the transistor Q4.

Example 3 provides the current mirror arrangement according to examples 1 or 2, where the second terminal of the transistor Q4 is coupled to a ground potential.

Example 4 provides the current mirror arrangement according to any one of the preceding examples, where the plurality of transistors further include a transistor Q5 and a transistor Q6, arranged so that the third terminal of the transistor Q3 is coupled to the first terminal of the transistor Q5, the third terminal of the transistor Q5 is coupled to the third terminal of the transistor Q6, the second terminal of the transistor Q6 is coupled to the first terminal of the transistor Q4, and the first terminal of the transistor Q3 is coupled to each of the third terminal of the transistor Q5 and the third terminal of the transistor Q6.

Example 5 provides the current mirror arrangement according to example 4, where the first terminal of the transistor Q6 is coupled to a reference voltage.

Example 6 provides the current mirror arrangement according to examples 4 or 5, where the second terminal of the transistor Q6 is coupled to a bias current.

Example 7 provides the current mirror arrangement according to any one of examples 4-6, where the second terminal of the transistor Q6 is coupled to a compensation capacitor.

Example 8 provides the current mirror arrangement according to example 7, further including a resistor coupled between the second terminal of the transistor Q6 and the compensation capacitor.

Example 9 provides the current mirror arrangement according to any one of the preceding examples, where the current mirror arrangement is configured to receive an input current (e.g., at the second terminal of the transistor Q1) and generate a mirrored current based on the input current (e.g., output at the second terminal of the transistor Q2).

In further examples of the current mirror arrangements according to any one of the preceding examples, third terminals of the transistors Q1 and Q2 may be coupled to ground potential, and/or second terminal of the transistor Q5 may be coupled to supply (complementary to ground). In still further examples of the current mirror arrangements according to any one of the preceding examples, the transistor type of the transistors Q1, Q2 and Q5 may be complementary to the transistor type of the transistors Q3, Q4 and Q6 (e.g., if the transistors Q1, Q2 and Q5 are N-type transistors, then the transistors Q3, Q4 and Q6 are P-type transistors, and vice versa).

Example 10 provides a current mirror arrangement that includes a current mirror circuit including an input transistor Q1 and an output transistor Q2, and further includes a transistor matrix, including a plurality of transistors, coupled between a first terminal of the input transistor Q1 and a second terminal of the input transistor Q1.

Example 11 provides the current mirror arrangement according to example 10, where the transistor matrix includes a transistor Q3, and the transistor Q3 and the input transistor Q1 are coupled in a loop, the loop including the first terminal of the input transistor Q1, the second terminal of the transistor Q3, the third terminal of the transistor Q3, and the second terminal of the input transistor Q1.

In a further example, the transistor matrix may further include a transistor Q4 such that the third terminal of the transistor Q4 is included in the loop of example 11. In such a loop, the transistor Q4 may function like a resistive load whose resistance may be equal to 1/gm(Q4).

Example 12 provides the current mirror arrangement according to example 11, where the loop is a first loop, the transistor matrix further includes transistors Q4, Q5, and Q6, and the transistors Q4, Q5, and Q6 and the input transistor Q1 are coupled in a second loop, the second loop including the first terminal of the input transistor Q1, the third terminal of the transistor Q4, the second terminal of the transistor Q6, the third terminal of the transistor Q6, the third terminal of the transistor Q5, the first terminal of the transistor Q5, and the second terminal of the input transistor Q1.

Example 13 provides the current mirror arrangement according to example 12, where the input transistor Q1 is configured to be driven with a combination of a signal of the first loop at the second terminal of the transistor Q3 and a signal of the second loop at the third terminal of the transistor Q4 (i.e., this combination of signals is applied to the first terminal of the input transistor Q1).

Example 14 provides the current mirror arrangement according to examples 12 or 13, where a gain of the second loop is higher than a gain of the first loop.

Example 15 provides the current mirror arrangement according to any one of examples 12-14, where, at lower frequencies of the input current, a gain of the current mirror arrangement is dominated by a gain of the second loop, and, at higher frequencies of the input current, the gain of the current mirror arrangement is dominated by a gain of the first loop.

Example 16 provides the current mirror arrangement according to any one of examples 12-15, further including a compensation capacitor coupled to the second loop (e.g., coupled to the second terminal of the transistor Q6).

Example 17 provides the current mirror arrangement according to any one of examples 12-16, further including a bias current source coupled to the second loop (e.g., coupled to the second terminal of the transistor Q6).

Example 18 provides the current mirror arrangement according to any one of the preceding examples, where each of the transistors Q3, Q4, and Q6 is a transistor of a first type of two types of transistors, each of the transistor Q1, Q2, and Q5 is a transistor of a second type of the two types of transistors, and the two types of transistors are N-type transistors (e.g., NMOS or NPN transistors) and P-type transistors (e.g., PMOS or PNP transistors).

For example, in some embodiments, the transistors Q3, Q4, and Q6 may be P-type transistors such as PMOS and/or PNP transistors, while the transistor Q1, Q2, and Q5 may be N-type transistors such as NMOS and/or NPN transistors. In other embodiments, the transistors Q3, Q4, and Q6 may be N-type transistors such as NMOS and/or NPN transistors, while the transistor Q1, Q2, and Q5 may be P-type transistors such as PMOS and/or PNP transistors.

In various further examples of the current mirror arrangement according to any one of examples 10-18, the transistors Q1-Q6 of the current mirror arrangement according to any one of examples 10-18 may be arranged as specified for the current mirror arrangement according to any one of examples 1-9.

Example 19 provides a current mirror arrangement that includes a current mirror circuit including an input transistor (Q1) and an output transistor (Q2), the current mirror circuit configured to receive an input current and generate an output current based on the input current. The current mirror arrangement further includes a plurality of further transistors, where a first sub-set of the plurality of further transistors are coupled to form a first feedback path from a first terminal of the input transistor to a second terminal of the input transistor, and a second sub-set of the plurality of further transistors are coupled to form a second feedback path from the first terminal of the input transistor to the second terminal of the input transistor, the second feedback path being different from the first feedback path (e.g., being different by virtue of the second sub-set of further transistors including at least one transistor not included in the first sub-set, or the first sub-set of further transistors including at least one transistor not included in the second sub-set).

Example 20 provides the current mirror arrangement according to example 19, where a gain of a loop formed by the input transistor and the second feedback path is higher than a gain of a loop formed by the input transistor and the first feedback path.

Example 21 provides the current mirror arrangement according to examples 19 or 20, where, at lower frequencies of the input current, a loop gain of the current mirror arrangement is dominated by a gain of a loop formed by the input transistor and the second feedback path, and, at higher frequencies of the input current, the loop gain of the current mirror arrangement is dominated by a gain of a loop formed by the input transistor and the first feedback path.

Example 22 provides the current mirror arrangement according to any one of examples 19-21, further including a compensation capacitor coupled to a loop formed by the input transistor and the second feedback path (e.g., coupled to the second terminal of the transistor Q6).

Example 23 provides the current mirror arrangement according to any one of examples 19-22, further including a bias current source coupled to a loop formed by the input transistor and the second feedback path (e.g., coupled to the second terminal of the transistor Q6).

In various further examples of the current mirror arrangement according to any one of examples 19-23, the transistors may be arranged as specified for the current mirror arrangement according to any one of examples 1-18.

Example 24 provides a current mirror arrangement that includes an input transistor Q1, configured to receive an input current, an output transistor Q2, configured to output a mirrored current based on the input current, where the drive signal is generated based on the mirrored current, and a transistor matrix, including a plurality of transistors, forming a first signal loop and a second signal loop, each of the first and second signal loops including a first terminal and a second terminal of the input transistor Q1.

Example 25 provides the current mirror arrangement according to example 24, where the current mirror arrangement further includes a bias current source coupled to the second loop, and a gain of the second loop is higher than a gain of the first loop.

In various further examples, the current mirror arrangement according to any one of examples 24-25 could be the current mirror arrangement according to any one of examples 1-23.

Example 26 provides an electronic device that includes an ADC, configured to perform analog-to-digital conversion; and further includes an ADC driver configured to provide a drive signal to the ADC to enable the ADC to perform the analog-to-digital conversion, the ADC driver including the current mirror arrangement according to any one of the preceding examples.

Example 27 provides the electronic device according to example 24, where the electronic device is, or is included in, automatic test equipment, test equipment, military radar/LIDAR, civil radar/LIDAR, automotive radar/LIDAR, industrial radar/LIDAR, cellular base stations, high speed wireline or wireless communication transceivers, or high speed digital control systems.

In other embodiments, the current mirror arrangement according to any one of the preceding examples may be incorporated in other kinds of components of an electronics device, besides being included in an ADC driver. Examples of other components where the current mirror arrangement according to any one of the preceding examples may be incorporated include amplifiers, mixers, and filters, e.g., high-speed amplifiers, high-speed mixers, and high-speed filters. In turn, such components may be included in devices such as automatic test equipment, test equipment, military radar/LIDAR, civil radar/LIDAR, automotive radar/LIDAR, industrial radar/LIDAR, cellular base stations, high speed wireline or wireless communication transceivers, or high speed digital control systems.

The invention claimed is:

1. An electronic device, comprising a current mirror arrangement, the current mirror arrangement inluding:
 a current mirror circuit comprising an input transistor and an output transistor, the current mirror circuit configured to receive an input current and generate an output current based on the input current; and
 a plurality of further transistors,
 where:
  a first sub-set of the plurality of further transistors are coupled to form a first feedback path from a first terminal of the input transistor to a second terminal of the input transistor, and
  a second sub-set of the plurality of further transistors are coupled to form a second feedback path from the first terminal of the input transistor to the second terminal of the input transistor, the second feedback path being different from the first feedback path.

2. The electronic device according to claim 1, wherein a gain of a loop formed by the input transistor and the second feedback path is higher than a gain of a loop formed by the input transistor and the first feedback path.

3. The electronic device according to claim 1, wherein, at lower frequencies of the input current, a loop gain of the current mirror arrangement is dominated by a gain of a loop formed by the input transistor and the second feedback path, and, at higher frequencies of the input current, the loop gain of the current mirror arrangement is dominated by a gain of a loop formed by the input transistor and the first feedback path.

4. The electronic device according to claim 1, further comprising a compensation capacitor coupled to a loop formed by the input transistor and the second feedback path.

5. The electronic device according to claim 1, further comprising a bias current source coupled to a loop formed by the input transistor and the second feedback path.

6. The electronic device according to claim 1, wherein the electronic device is a driver for an analog-to-digital converter.

7. The electronic device according to claim 1, wherein the electronic device is a system that includes an analog-to-digital converter (ADC) and a driver for the ADC, and wherein the current mirror arrangement is included in the driver for the ADC.

8. An electronic device, comprising a current mirror arrangement, the current mirror arrangement including:
 a plurality of transistors, each transistor having a first terminal, a second terminal, and a third terminal, the plurality of transistors including at least transistors Q1, Q2, Q3, and Q4, arranged so that:
  the first terminal of the transistor Q1 is coupled to the first terminal of the transistor Q2,
  the second terminal of the transistor Q1 is coupled to the third terminal of the transistor Q3, and
  the first terminal of the transistor Q1 is further coupled to each of the second terminal of the transistor Q3 and the third terminal of the transistor Q4.

9. The electronic device according to claim 8, wherein the second terminal of the transistor Q3 is coupled to the third terminal of the transistor Q4.

10. The electronic device according to claim 8, wherein the second terminal of the transistor Q4 is coupled to a ground potential.

11. The electronic device according to claim 8, wherein the plurality of transistors further include a transistor Q5 and a transistor Q6, arranged so that:
 the third terminal of the transistor Q3 is coupled to the first terminal of the transistor Q5,
 the third terminal of the transistor Q5 is coupled to the third terminal of the transistor Q6,
 the second terminal of the transistor Q6 is coupled to the first terminal of the transistor Q4, and
 the first terminal of the transistor Q3 is coupled to each of the third terminal of the transistor Q5 and the third terminal of the transistor Q6.

12. The electronic device according to claim 11, wherein the first terminal of the transistor Q6 is coupled to a reference voltage.

13. The electronic device according to claim 11, wherein the second terminal of the transistor Q6 is coupled to a bias current.

14. The electronic device according to claim 8, wherein the electronic device is a driver for an analog-to-digital converter.

15. The electronic device according to claim 8, wherein the electronic device is a system that includes an analog-to-digital converter (ADC) and a driver for the ADC, and wherein the current mirror arrangement is included in the driver for the ADC.

16. An electronic device, comprising a current mirror arrangement, the current mirror arrangement including:
 a current mirror circuit comprising an input transistor Q1 and an output transistor Q2; and
 a transistor matrix, comprising a plurality of transistors, coupled between a first terminal of the input transistor Q1 and a second terminal of the input transistor Q1.

17. The electronic device according to claim 16, wherein:
 the transistor matrix includes a transistor Q3, and
 the transistor Q3 and the input transistor Q1 are coupled in a loop, the loop including the first terminal of the input transistor Q1, the second terminal of the transistor Q3, the third terminal of the transistor Q3, and the second terminal of the input transistor Q1.

18. The electronic device according to claim 17, wherein:
 the loop is a first loop,
 the transistor matrix further includes transistors Q4, Q5, and Q6, and the transistors Q4, Q5, and Q6 and the input transistor Q1 are coupled in a second loop, the second loop including the first terminal of the input transistor Q1, the third terminal of the transistor Q4, the second terminal of the transistor Q6, the third terminal of the transistor Q6, the third terminal of the transistor Q5, the first terminal of the transistor Q5, and the second terminal of the input transistor Q1.

19. The electronic device according to claim 18, wherein the input transistor Q1 is configured to be driven with a combination of a signal of the first loop at the second terminal of the transistor Q3 and a signal of the second loop at the third terminal of the transistor Q4.

20. The electronic device according to claim 18, wherein a gain of the second loop is higher than a gain of the first loop.

21. The electronic device according to claim 18, wherein, at lower frequencies of the input current, a gain of the current mirror arrangement is dominated by a gain of the second loop, and, at higher frequencies of the input current, the gain of the current mirror arrangement is dominated by a gain of the first loop.

22. The electronic device according to claim 18, further comprising a capacitor coupled to the second loop.

23. The electronic device according to claim 18, further comprising a bias current source coupled to the second loop.

24. The electronic device according to claim 18, wherein:
each of the transistors Q3, Q4, and Q6 is a transistor of a first type of two types of transistors,
each of the transistor Q1, Q2, and Q5 is a transistor of a second type of the two types of transistors, and
the two types of transistors are N-type transistors and P-type transistors.

25. The electronic device according to claim 16, wherein the electronic device is a driver for an analog-to-digital converter.

26. The electronic device according to claim 16, wherein the electronic device is a system that includes an analog-to-digital converter (ADC) and a driver for the ADC, and wherein the current mirror arrangement is included in the driver for the ADC.

* * * * *